United States Patent
Yokogawa

(10) Patent No.: US 10,728,506 B2
(45) Date of Patent: Jul. 28, 2020

(54) OPTICAL FILTER, SOLID STATE IMAGING DEVICE, AND ELECTRONIC APPARATUS

(71) Applicant: SONY CORPORATION, Tokyo (JP)

(72) Inventor: Sozo Yokogawa, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 89 days.

(21) Appl. No.: 15/311,726

(22) PCT Filed: May 27, 2015

(86) PCT No.: PCT/JP2015/065194
§ 371 (c)(1),
(2) Date: Nov. 16, 2016

(87) PCT Pub. No.: WO2015/190291
PCT Pub. Date: Dec. 17, 2015

(65) Prior Publication Data
US 2017/0127024 A1    May 4, 2017

(30) Foreign Application Priority Data
Jun. 9, 2014    (JP) .................................. 2014-118612

(51) Int. Cl.
*H04N 9/083* (2006.01)
*H01L 27/14* (2006.01)
(Continued)

(52) U.S. Cl.
CPC ............. *H04N 9/083* (2013.01); *G02B 5/008* (2013.01); *G02B 5/204* (2013.01); *G02B 5/22* (2013.01);
(Continued)

(58) Field of Classification Search
CPC .......... G02B 5/201; G02B 5/22; G02B 1/115; G02B 5/208; G02B 5/285; G02B 5/20;
(Continued)

(56) References Cited

U.S. PATENT DOCUMENTS

2003/0173501 A1* 9/2003 Thio ...................... B82Y 20/00
250/216
2006/0273245 A1* 12/2006 Kim ...................... G01J 3/0259
250/226
(Continued)

FOREIGN PATENT DOCUMENTS

| CN | 102403327 A | 4/2012 |
| CN | 103733340 A | 4/2014 |

(Continued)

OTHER PUBLICATIONS

Ohkado, et al., "Structural Optimization of Metallic Infrared Filters Based on Extraordinary Optical Transmission", Transactions of the Materials Research Society of Japan, Jun. 2013, vol. 38, No. 2, pp. 167-170.
(Continued)

*Primary Examiner* — Jade R Chwasz
(74) *Attorney, Agent, or Firm* — Chip Law Group

(57) ABSTRACT

An optical filter that suppresses the occurrence of color mixing due to wavelength components on the short wavelength side relative to the desired transmission component. The optical filter includes a metal thin-film filter in which a plurality of openings are periodically arranged, and a first dielectric layer that coats a surface of the metal thin-film filter and coats or fills an interior of the opening of the metal thin-film filter. The optical filter also includes a second dielectric layer having a refractive index lower than a refractive index of the first dielectric layer and formed at
(Continued)

least on an incidence surface side of the metal thin-film filter. The present technology can be applied to a hole array filter.

12 Claims, 14 Drawing Sheets

(51) Int. Cl.
    *G02B 5/20*     (2006.01)
    *H01L 27/146*     (2006.01)
    *G02B 5/00*     (2006.01)
    *H04N 5/3745*     (2011.01)
    *G02B 5/22*     (2006.01)
    *H04N 5/378*     (2011.01)

(52) U.S. Cl.
    CPC ........ *H01L 27/14* (2013.01); *H01L 27/14621* (2013.01); *H01L 27/14625* (2013.01); *H04N 5/3745* (2013.01); *H04N 5/378* (2013.01)

(58) Field of Classification Search
    CPC ....... G02B 5/286; G02B 5/288; H01L 27/322; H01L 27/124; H01L 27/14621; H04N 9/045; H04N 5/378; H04N 9/083
    USPC ....... 359/885, 890, 891, 892, 577, 580, 585, 359/586, 589, 588, 590
    See application file for complete search history.

(56) References Cited

U.S. PATENT DOCUMENTS

| | | |
|---|---|---|
| 2012/0061553 A1 | 3/2012 | Yokogawa |
| 2012/0156714 A1* | 6/2012 | O'Brien ................. G01J 3/2803 435/29 |
| 2013/0032915 A1* | 2/2013 | Tonotani ........... H01L 27/14621 257/432 |
| 2014/0146207 A1 | 5/2014 | Yokogawa |

FOREIGN PATENT DOCUMENTS

| | | |
|---|---|---|
| EP | 2432019 A1 | 3/2012 |
| EP | 2738810 A1 | 6/2014 |
| JP | 2011-191688 A | 9/2011 |
| JP | 2012-064703 A | 3/2012 |
| JP | 2013-030626 A | 2/2013 |
| KR | 10-2012-0029324 A | 3/2012 |
| KR | 10-2014-0053948 A | 5/2014 |
| TW | 201222796 A | 6/2012 |
| TW | 201308585 A | 2/2013 |
| WO | 2013/015117 A1 | 1/2013 |

OTHER PUBLICATIONS

International Search Report and Written Opinion of PCT Application No. PCT/JP2015/065194, dated Aug. 18, 2015, 06 pages of English Translation and 06 pages of ISRWO.

* cited by examiner

OPTICAL FILTER, SOLID STATE IMAGING DEVICE, AND ELECTRONIC APPARATUS

CROSS REFERENCE TO RELATED APPLICATIONS

This application is a U.S. National Phase of International Patent Application No. PCT/JP2015/065194 filed on May 27, 2015, which claims priority benefit of Japanese Patent Application No. JP 2014-118612 filed in the Japan Patent Office on Jun. 9, 2014. The above-referenced applications is hereby incorporated herein by reference in its entirety.

TECHNICAL FIELD

The present technology relates to an optical filter, a solid state imaging device, and an electronic apparatus, and relates particularly to an optical filter, a solid state imaging device, and an electronic apparatus that make it possible to suppress the occurrence of color mixing.

BACKGROUND ART

In the year 1998, a phenomenon in which a metal thin-film filter (a hole array filter) in which openings each with a size smaller than the wavelengths of visible light are arranged two-dimensionally and periodically transmits a wavelength component corresponding to the periodic pattern of the openings with high efficiency was discovered. Since then, various studies and application uses of the metal thin-film filter have been proposed (e.g. see Non-Patent Literatures 1 and 2).

In such a metal thin-film filter, the color and the wavelength component intended to be transmitted, the transmission characteristics, the light polarization dependence, etc. are controlled by the size, shape, and periodic pattern of the opening. The physical mechanism that determines the transmission characteristics of the metal thin-film filter is the point that an electromagnetic wave is transmitted by means of surface plasmon polaritons (SPPs) in which free electrons of the metal surface are coupled with the electromagnetic wave. Such a metal thin-film filter processed by periodic microfabrication is widely known as a plasmonic filter.

The plasmonic filter is a filter formed of a simple metal thin-film, and has advantages of high compatibility with a method of forming a fine structure on a two-dimensional plane, such as lithography, and high flexibility of the design of the optical characteristics. Hence, the hole array filter is used for, for example, color filters etc. of charge-coupled device (CCD) image sensors and complementary metal oxide semiconductor (CMOS) image sensors (e.g. Patent Literatures 1 to 4 and Non-Patent Literatures 3 and 4).

CITATION LIST

Patent Literature

Patent Literature 1: JP 2008-177191A
Patent Literature 2: WO 08/82569
Patent Literature 3: JP 2009-147326A
Patent Literature 4: JP 2012-59865A

Non-Patent Literature

Non-Patent Literature 1: Ebbesen, Thomas W., et al. "Extraordinary optical transmission through sub-wavelength hole arrays." Nature 391.6668 (1998): 667-669.
Non-Patent Literature 2: Barnes, William L., Alain Dereux, and Thomas W. Ebbesen. "Surface plasmon subwavelength optics." Nature 424.6950 (2003): 824-830.
Non-Patent Literature 3: Chen, Qin, and David R S Cumming. "High transmission and low color cross-talk plasmonic color filters using triangular-lattice hole arrays in aluminum films." Optics express 18.13 (2010): 14056-14062.
Non-Patent Literature 4: Yokogawa Sozo, Stanley P. Burgos, and Harry A. Atwater. "Plasmonic color filters for CMOS image sensor applications." Nano letters 12.8 (2012): 4349-4354.

SUMMARY OF INVENTION

Technical Problem

The transmission characteristics of the plasmonic filter are determined by the synthesis of various transmission modes of electromagnetic waves. For example, in the hole array filter, which is a kind of plasmonic filter, there is a transmission mode in which light is optically transmitted (hereinafter, referred to as a photonic mode), as well as a transmission mode by means of the surface (locally present) (hereinafter, referred to as a plasmonic mode).

In the case of a long wavelength relative to the size of the opening arranged in the hole array filter, light cannot be transmitted as light through the hole array filter. On the other hand, in the case of a short wavelength relative to the size of the opening, light can be transmitted as light through the hole array filter.

For example, in a hole array filter formed of an Al thin-film with its surface coated with $SiO_2$, in order to transmit light of a wavelength of 600 nm as plasmons, it is necessary to set the diameter of the opening (the opening diameter) to approximately 200 nm. On the other hand, when the opening diameter is 200 nm, light of a wavelength of 450 nm or less, such as ultraviolet light or blue light, is transmitted as light through the hole array filter. That is, in the conventional plasmonic filter, there has been a fear that color mixing will occur due to wavelength components on the short wavelength side relative to the desired transmission component.

The present technology has been made in view of such circumstances, and makes it possible to suppress the occurrence of color mixing due to wavelength components on the short wavelength side relative to the desired transmission component.

Solution to Problem

According to an aspect of the present technology, an optical filter includes: a metal thin-film filter in which a plurality of openings are periodically arranged; a first dielectric layer coating a surface of the metal thin-film filter and formed so as to coat or fill an interior of the opening of the metal thin-film filter; and a second dielectric layer having a refractive index lower than a refractive index of the first dielectric layer and formed at least on an incidence surface side of the metal thin-film filter. An opening diameter of the metal thin-film filter is smaller than a wavelength in the second dielectric layer of an electromagnetic wave to be transmitted, and a thickness of the first dielectric layer is substantially equal to or thinner than the wavelength in the second dielectric layer of the electromagnetic wave.

A real part of a complex refractive index of a material that forms the first dielectric layer may be larger than a real part of a complex refractive index of a material that forms the second dielectric layer.

The second dielectric layer may be formed also on an emitting surface side of the metal thin-film filter.

A spacing between openings of the metal thin-film filter may be set to a distance substantially equal to a wavelength of the electromagnetic wave.

When the wavelength of the electromagnetic wave is denoted by $\lambda$ and a real part of a complex refractive index of the first dielectric layer is denoted by N, the spacing between openings of the metal thin-film filter may be set to a distance of $0.5\lambda/N$ to $2.0\lambda/N$.

A shape of the opening of the metal thin-film filter may be a circle, a square, or a cross shape or a square U shape in which a horizontal to vertical ratio is 1:1.

A shape of the opening of the metal thin-film filter may be an ellipse, a rectangular shape, or a cross shape or a square U shape in which a horizontal to vertical ratio is not 1:1.

The openings of the metal thin-film filter may be arranged in a square array.

The openings of the metal thin-film filter may be arranged in a triangular array.

The openings of the metal thin-film filter may be each formed as a slit, and are aligned in a short side direction of the slit.

According to an aspect of the present technology, a solid state imaging device includes: an optical filter including a metal thin-film filter in which a plurality of openings are periodically arranged, a first dielectric layer coating a surface of the metal thin-film filter and formed so as to coat or fill an interior of the opening of the metal thin-film filter, and a second dielectric layer having a refractive index lower than a refractive index of the first dielectric layer and formed at least on an incidence surface side of the metal thin-film filter. An opening diameter of the metal thin-film filter is smaller than a wavelength in the second dielectric layer of an electromagnetic wave to be transmitted, and a thickness of the first dielectric layer is substantially equal to or thinner than the wavelength in the second dielectric layer of the electromagnetic wave.

According to an aspect of the present technology, an electronic apparatus includes: a solid state imaging device including an optical filter including a metal thin-film filter in which a plurality of openings are periodically arranged, a first dielectric layer coating a surface of the metal thin-film filter and formed so as to coat or fill an interior of the opening of the metal thin-film filter, and a second dielectric layer having a refractive index lower than a refractive index of the first dielectric layer and formed at least on an incidence surface side of the metal thin-film filter. An opening diameter of the metal thin-film filter is smaller than a wavelength in the second dielectric layer of an electromagnetic wave to be transmitted, and a thickness of the first dielectric layer is substantially equal to or thinner than the wavelength in the second dielectric layer of the electromagnetic wave.

According to an aspect of the present technology, a first dielectric layer coats a surface of the metal thin-film filter in which a plurality of openings are periodically arranged, and is formed so as to coat or fill an interior of the opening of the metal thin-film filter, and a second dielectric layer having a refractive index lower than a refractive index of the first dielectric layer and formed at least on an incidence surface side of the metal thin-film filter. An opening diameter of the metal thin-film filter is smaller than a wavelength in the second dielectric layer of an electromagnetic wave to be transmitted, and a thickness of the first dielectric layer is substantially equal to or thinner than the wavelength in the second dielectric layer of the electromagnetic wave.

Advantageous Effects of Invention

According to an aspect of the present technology, it becomes possible to suppress the occurrence of color mixing due to wavelength components on the short wavelength side relative to the desired transmission component.

DESCRIPTION OF EMBODIMENT(S)

Hereinbelow, embodiments of the present technology are described with reference to the drawings.

<Examples of the Structure of the Hole Array Filter>

Figure 1:
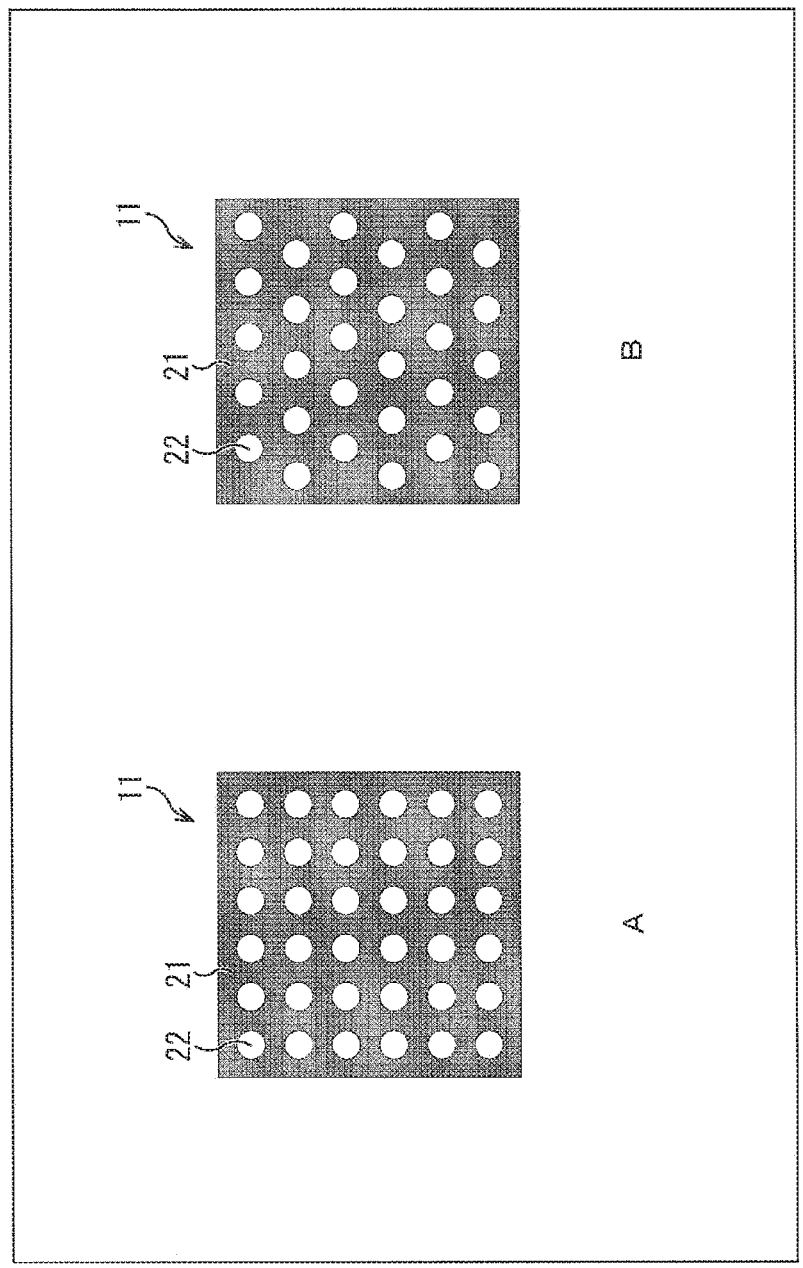
FIG. 1 is plan views showing examples of the structure of a hole array filter.

FIG. 1 is a plan view showing examples of the structure of a typical hole array filter to which the present technology is applied.

A hole array filter 11 shown in A of FIG. 1 is configured as a plasmonic filter by a plurality of openings 22 being arranged in a square array in a metal thin-film filter 21. Further, a hole array filter 11 shown in B of FIG. 1 is configured as a plasmonic filter by a plurality of openings 22 being arranged in a triangular array in a metal thin-film filter 21.

Although details are described later, in the hole array filter 11, the surroundings of the metal thin-film filter 21 are covered with a not-shown dielectric layer.

The metal thin-film filter 21 is made of one of Al, Ag, Au, Cu, and W, or is made of an alloy containing any of them, and the thickness of the metal thin-film filter 21 is set between approximately 50 nm and 300 nm.

The opening 22 is formed such that the opening diameter is smaller than the wavelength of the electromagnetic wave (light) intended to be transmitted.

<Structure of a Conventional Hole Array Filter>

Next, the structure of a conventional hole array filter is described with reference to FIG. 2.

Figure 2:
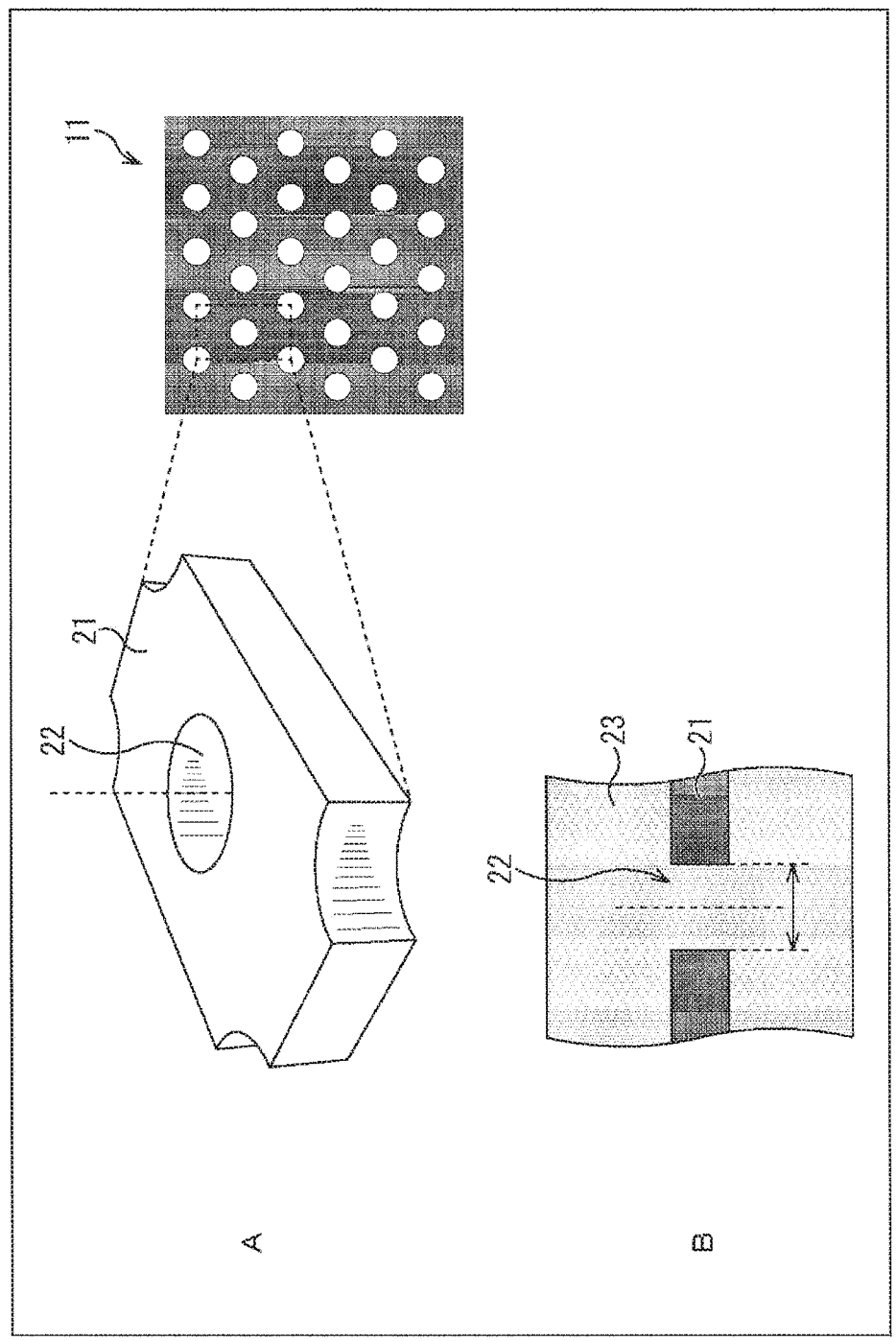
FIG. 2 is a perspective view and a cross-sectional view showing an example of the structure of a conventional hole array filter.

A of FIG. 2 shows a perspective view of a portion of one of openings 22 arranged in a triangular array and its surroundings cut out of a hole array filter 11, which is indicated by the broken line in the drawing, and B of FIG. 2 shows a cross-sectional view of a cut-out portion of one of the openings 22 and its surroundings.

In particular, as shown in B of FIG. 2, in the conventional hole array filter 11, both sides of the light incidence surface side and the light emitting surface side of the metal thin-film filter 21 are covered with a dielectric layer 23, and the interior of the opening 22 is filled with the dielectric layer 23.

In the hole array filter 11 of such a structure, the dispersion relation of the surface plasmon is determined by the relative permittivity and the magnetic permeability of the metal that forms the metal thin-film filter 21 and the material of the dielectric layer 23 in contact with the metal.

Figure 3:
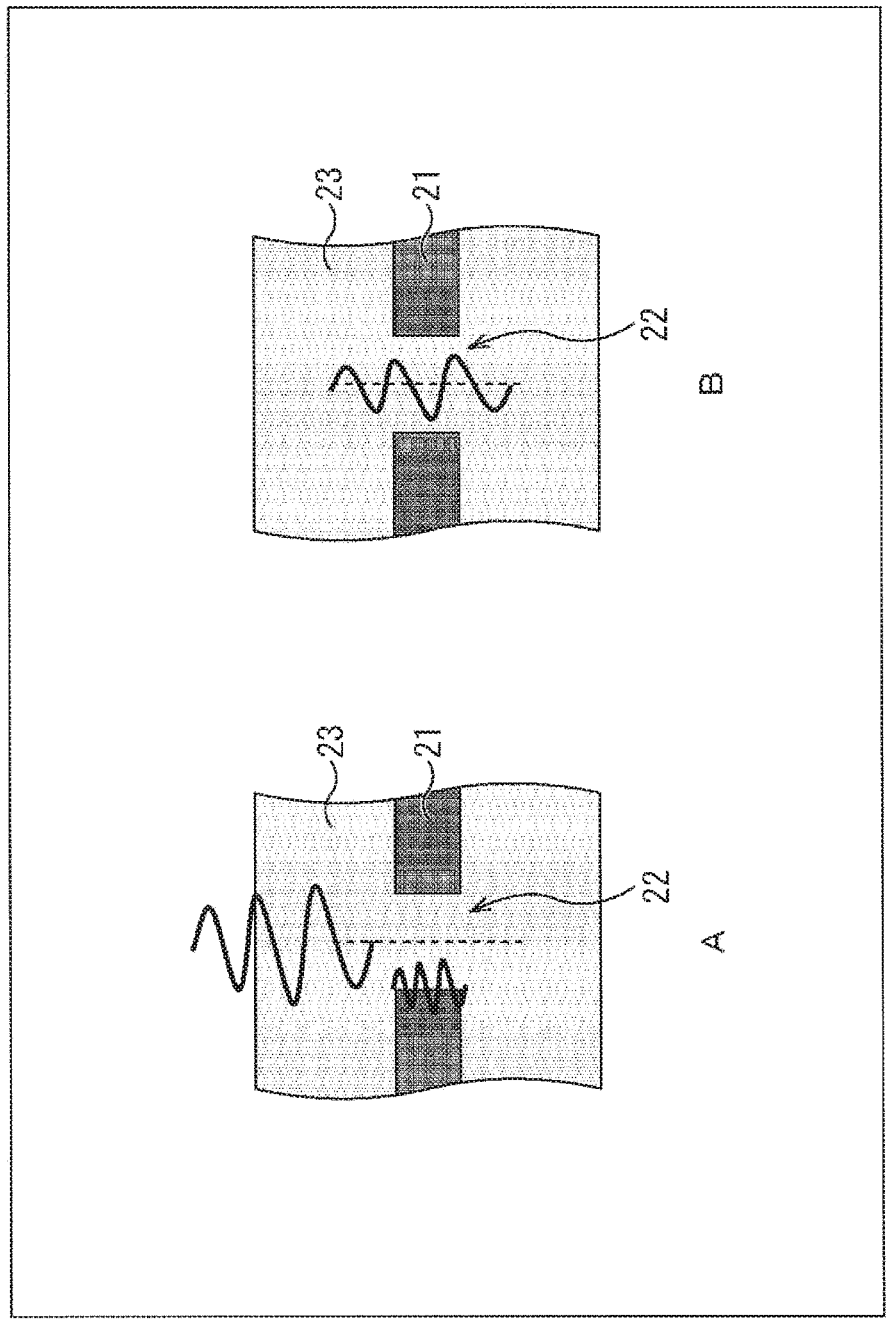
FIG. 3 is a diagram describing optical characteristics of the conventional hole array filter.

As shown in A of FIG. 3, an electromagnetic wave incident on the incidence surface side of the hole array filter 11 is propagated as surface plasmons through the interface between the metal surface inside the opening 22 and the dielectric layer 23, is thereby transmitted through the hole array filter 11, and is emitted to the emitting surface side of the hole array filter 11.

In the case where the wavelength of the electromagnetic wave incident on the incidence surface side is much shorter than the opening diameter of the opening 22, the electromagnetic wave is transmitted as light (photons) through the hole array filter 11 as shown in B of FIG. 3. In this case, the effective wavelength of the electromagnetic wave in the dielectric layer 23 is determined by the refractive index of the dielectric layer 23.

Thus, in the conventional hole array filter, although the opening diameter of the opening is formed so as to be smaller than the wavelength of the electromagnetic wave intended to be transmitted, light of a wavelength much shorter than the opening diameter of the opening is transmitted as light. That is, in the conventional hole array filter, there has been a fear that color mixing will occur due to wavelength components on the short wavelength side relative to the desired transmission component.

Furthermore, in the conventional hole array filter, since the interference of surface plasmons between adjacent openings greatly influences the transmission characteristics, there has been a problem that transmission efficiency is degraded unless a certain spacing between openings (period) is provided. For example, according to Non-Patent Literature 4, in the case of a hole array filter formed of an Al thin-film, a period of openings of approximately 5 µm is needed.

<Structure of the Hole Array Filter of the Present Technology>

Next, the structure of a hole array filter to which the present technology is applied is described with reference to FIG. 4.

Figure 4:
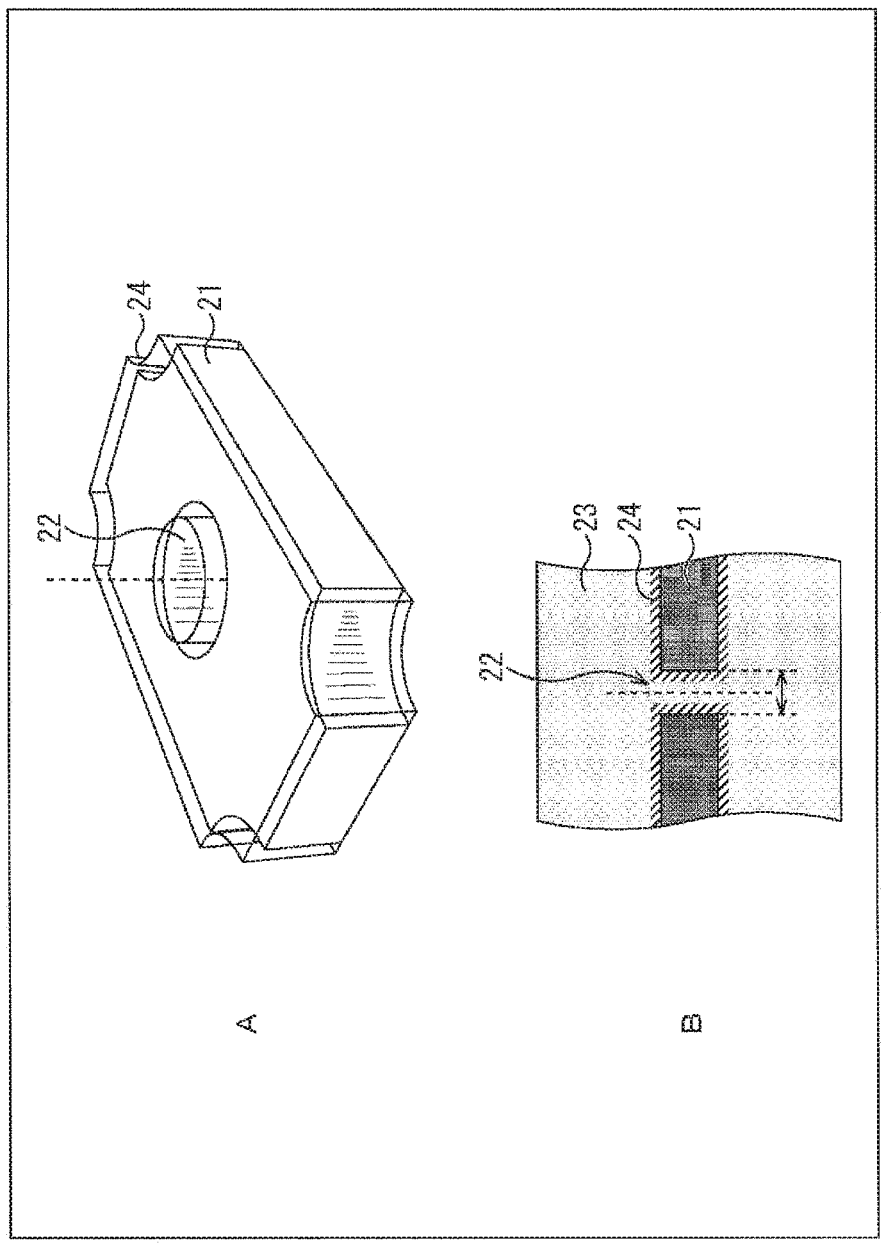
FIG. 4 is a perspective view and a cross-sectional view showing an example of the structure of a hole array filter of the present technology.

A of FIG. 4 shows, similarly to A of FIG. 2, a perspective view of a portion of one of openings 22 arranged in a triangular array and its surroundings cut out of a hole array filter 11, and B of FIG. 4 shows a cross-sectional view of a cut-out portion of one of the openings 22 and its surroundings.

As shown in A and B of FIG. 4, in the hole array filter 11 to which the present technology is applied, the surface of the metal thin-film filter 21 is coated with a dielectric layer 24, and the inner wall of the opening 22 is coated with the dielectric layer 24.

Further, as shown in B of FIG. 4, for the metal thin-film filter 21 coated with the dielectric layer 24, both sides of the light incidence surface side and the light emitting surface side are covered with a dielectric layer 23, and the interior of the opening 22 is filled with the dielectric layer 23.

The opening 22 is formed such that the opening diameter is smaller than the effective wavelength in the dielectric layer 23 of the desired electromagnetic wave intended to be transmitted.

Further, the spacing between openings 22 (period) is set to a distance substantially equal to the wavelength of the desired electromagnetic wave intended to be transmitted. For example, when the wavelength of the desired electromagnetic wave intended to be transmitted is denoted by $\lambda$ and the real part of the complex refractive index of the dielectric layer 24 is denoted by N, the period of the openings 22 is set to a distance of $0.5\lambda/N$ to $2.0\lambda/N$.

The dielectric layer 23 is made of a material containing any of silicon oxide and magnesium fluoride. The dielectric layer 24 is made of one of silicon nitride, hafnium oxide, aluminum oxide, titanium oxide, zirconium oxide, and tantalum oxide, or is made of a material containing any of them.

The dielectric layer 24 is formed such that its thickness is substantially equal to or thinner than the effective wavelength in the dielectric layer 23 of the desired electromagnetic wave intended to be transmitted.

Further, the dielectric layer 24 has a refractive index larger than the refractive index of the dielectric layer 23. Specifically, the real part of the complex refractive index of the material that forms the dielectric layer 24 is set larger than the real part of the complex refractive index of the material that forms the dielectric layer 23.

In the hole array filter 11 to which the present technology is applied, the dispersion relation of the surface plasmon is determined by the relative permittivity and the magnetic permeability of the metal that forms the metal thin-film filter 21 and the material of the dielectric layer 24 in contact with the metal. Since the real part of the complex refractive index of the material that forms the dielectric layer 24 is larger than the real part of the complex refractive index of the material that forms the dielectric layer 23, in the case of achieving similar characteristics to the propagation characteristics and the transmission characteristics of surface plasmons described with reference to A of FIG. 3, the opening diameter of the opening 22 can be set smaller and the period of the openings 22 can be set shorter than in the structure of the conventional hole array filter.

Figure 5:
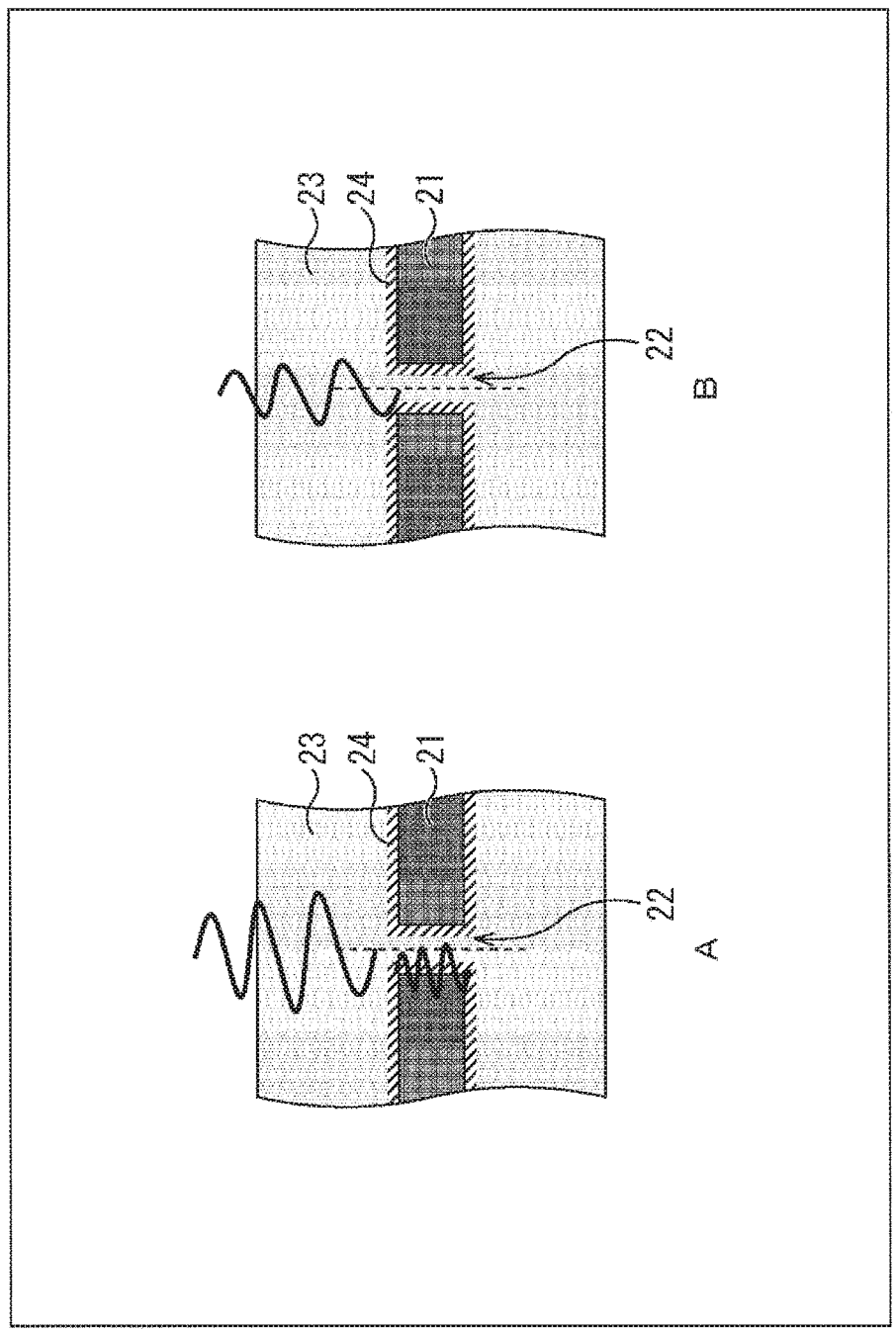
FIG. 5 is a diagram describing optical characteristics of the hole array filter of the present technology.

Even in this case, as shown in A of FIG. 5, an electromagnetic wave incident on the incidence surface side of the hole array filter 11 is propagated as surface plasmons through the interface between the metal surface inside the opening 22 and the dielectric layer 24, is thereby transmitted through the hole array filter 11, and is emitted to the emitting surface side of the hole array filter 11, as a matter of course.

Further, since the dielectric layer 24 having a refractive index higher than the refractive index of the dielectric layer 23 is present also on the inner wall of the opening 22, the opening diameter of the opening 22 is smaller than in the structure of the conventional hole array filter 11; therefore, as shown in B of FIG. 5, even when an electromagnetic wave with a similar wavelength to B of FIG. 3 is incident on the incidence surface side, the electromagnetic wave cannot be transmitted as light (photons) through the hole array filter 11.

<Simulation Results of the Transmission Characteristics>

Here, the simulation results of the transmission characteristics of the conventional hole array filter 11 and the hole array filter 11 to which the present technology is applied are described with reference to FIG. 6. The simulation is performed using the finite-difference time-domain (FDTD) method.

Figure 6:
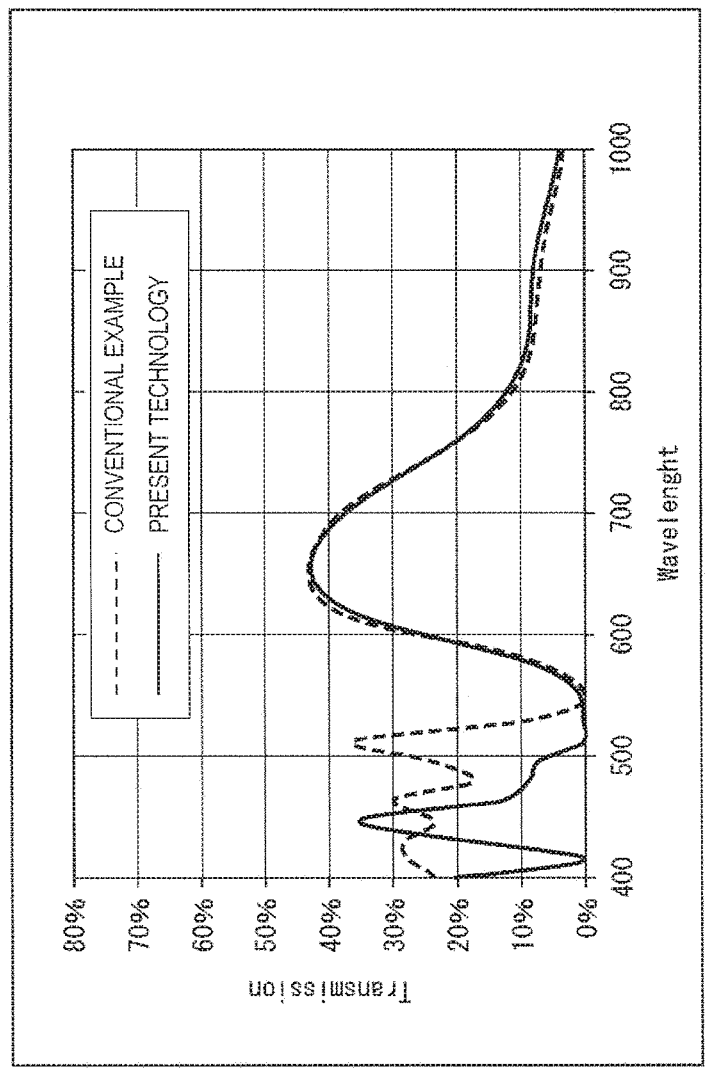
FIG. 6 is a diagram showing the simulation results of the transmission characteristics.

In the graph of FIG. 6, the horizontal axis represents the wavelength of the electromagnetic wave, and the vertical axis represents the relative transmittance. In the graph, the broken line indicates the transmittance in the case where the conventional hole array filter 11 is optimized so that red light is transmitted, and the solid line indicates the transmittance in the case where the hole array filter 11 of the present technology is optimized so that red light is transmitted.

As shown in the graph of FIG. 6, around the wavelengths of 600 nm to 700 nm including red light, the transmission characteristics depict substantially identical curves in the hole array filter 11 of the present technology and the conventional hole array filter 11.

On the other hand, around the wavelengths of 400 nm to 500 nm, 20% to 30% transmission components are present at 400 nm to 530 nm in the transmission characteristics of the conventional hole array filter 11. That is, blue light gets color-mixed in the red light transmitted through the conventional hole array filter 11.

This is due to the fact that, in the conventional hole array filter 11, when an electromagnetic wave with a desired wavelength is transmitted in the plasmonic mode, an electromagnetic wave with a wavelength shorter than the desired wavelength is transmitted in the photonic mode.

In contrast, in the hole array filter 11 of the present technology, although a peak of a transmission component has appeared around the wavelength of 440 nm, transmission components are suppressed in the other wavelength ranges as compared to the conventional hole array filter 11.

That is, in the hole array filter 11 of the present technology, the wavelength range transmitted in the photonic mode in the conventional hole array filter 11 can be shifted to the short wavelength side.

Thus, by the structure of the present technology, the transmission characteristics of the plasmonic mode can be maintained while the contribution of the photonic mode is suppressed in a desired wavelength range (e.g. the wavelength range of visible light); as a result, it becomes possible to suppress the occurrence of color mixing due to wavelength components on the short wavelength side relative to the desired transmission component.

Furthermore, by the structure of the present technology, the transmission characteristics of the hole array filter 11 as a plasmonic filter can be controlled by the dispersion relation of the surface plasmon determined by the metal that forms the metal thin-film filter 21 and the dielectric layer 24 having a refractive index higher than the refractive index of the dielectric layer 23, and therefore the period of the openings 22 can be made smaller. Thereby, the size of the hole array filter can be reduced while the transmission characteristics are maintained, as compared to the conventional structure. Furthermore, when the size of the hole array filter is not made small, the number of openings 22 can be increased, and therefore the robustness of the optical characteristics can be improved.

Although in FIG. 4 the inner wall of the opening 22 is coated with the dielectric layer 24, the entire interior of the opening 22 may be filled with the dielectric layer 24.

<Other Examples of the Structure of the Hole Array Filter>

In the hole array filter to which the present technology is applied, a plurality of openings are periodically arranged in the metal thin-film filter as described above; the shape of the opening may be an arbitrary shape.

Figure 7:
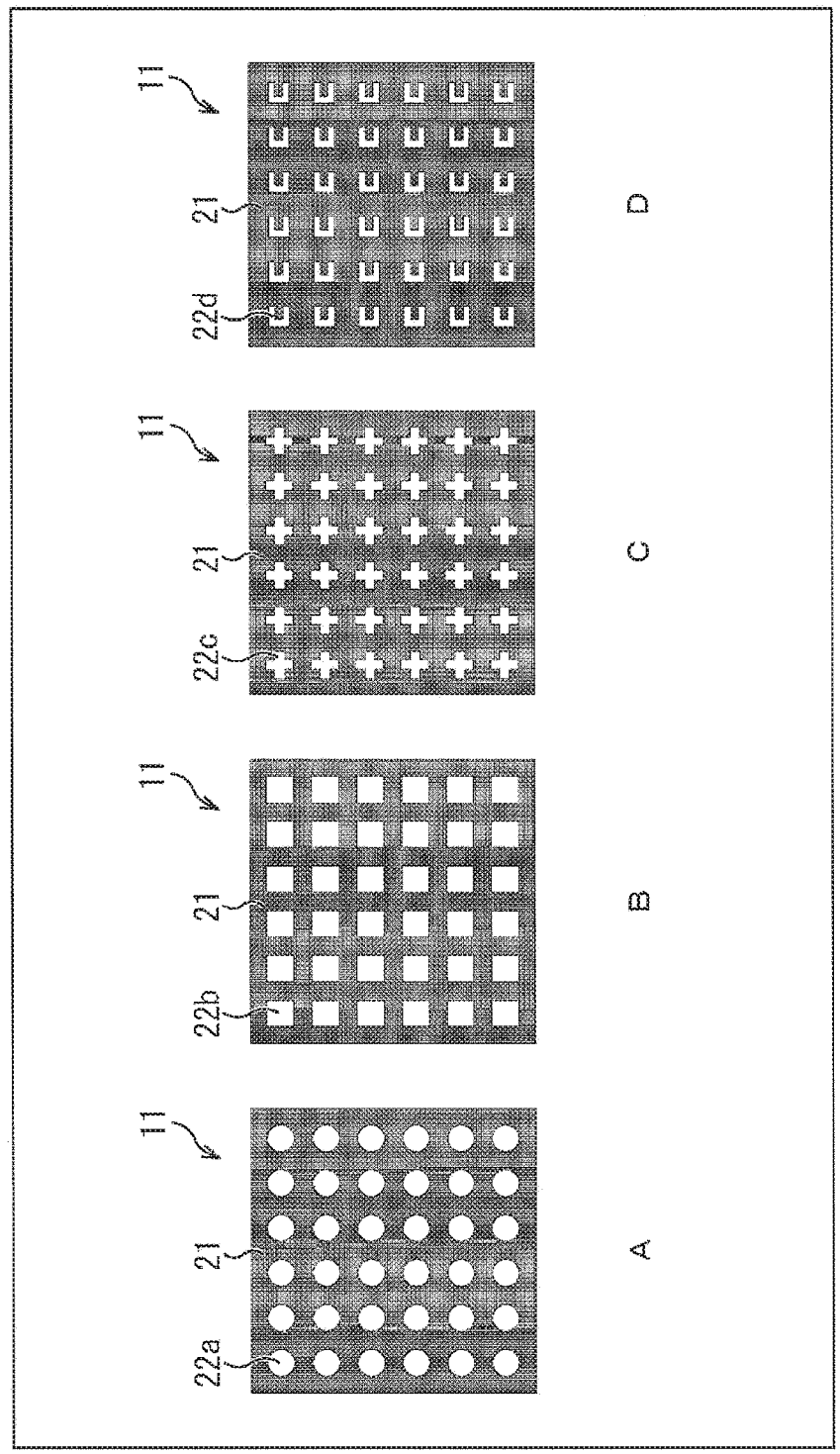
FIG. 7 is plan views showing other examples of the structure of the hole array filter.

FIG. 7 shows examples of the structure of the hole array filter in which openings with various shapes are provided.

In the hole array filter 11 shown in A of FIG. 7, similarly to the configuration described above, circular openings 22a are arranged in a square array in the metal thin-film filter 21; and in the hole array filter 11 shown in B of FIG. 7, square openings 22b are arranged in a square array in the metal thin-film filter 21.

Further, in the hole array filter 11 shown in C of FIG. 7, cross-shaped openings 22c are arranged in a square array in the metal thin-film filter 21; and in the hole array filter 11 shown in D of FIG. 7, square U-shaped openings 22d are arranged in a square array in the metal thin-film filter 21.

Figure 8:
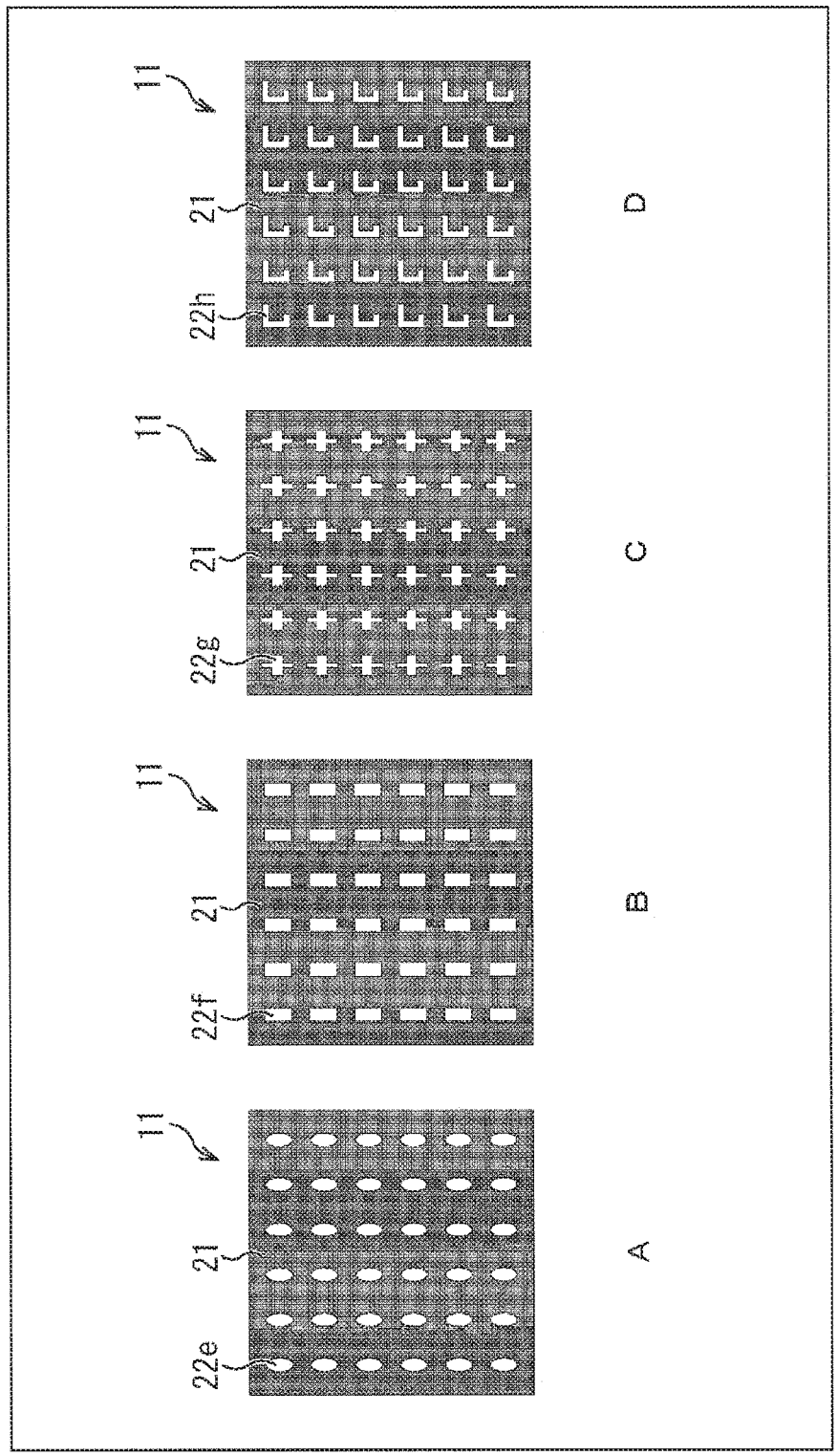
FIG. 8 is plan views showing other examples of the structure of the hole array filter.

Although the shapes of the opening of the hole array filter 11 shown in FIG. 7 are shapes in which the horizontal to vertical ratio is 1:1, shapes in which the horizontal to vertical ratio is not 1:1 may be used as shown in FIG. 8.

In the hole array filter 11 shown in A of FIG. 8, elliptical openings 22e are arranged in a square array in the metal thin-film filter 21; and in the hole array filter 11 shown in B of FIG. 8, rectangular openings 22f are arranged in a square array in the metal thin-film filter 21.

Further, in the hole array filter 11 shown in C of FIG. 8, cross-shaped openings 22g in each of which the horizontal to vertical ratio is not 1:1 are arranged in a square array in the metal thin-film filter 21; and in the hole array filter 11 shown in D of FIG. 8, square U-shaped openings 22h in each of which the horizontal to vertical ratio is not 1:1 are arranged in a square array in the metal thin-film filter 21.

Further, in the hole array filter to which the present technology is applied, the openings periodically arranged in the metal thin-film filter may be arranged in an arbitrary arrangement pattern.

Figure 9:
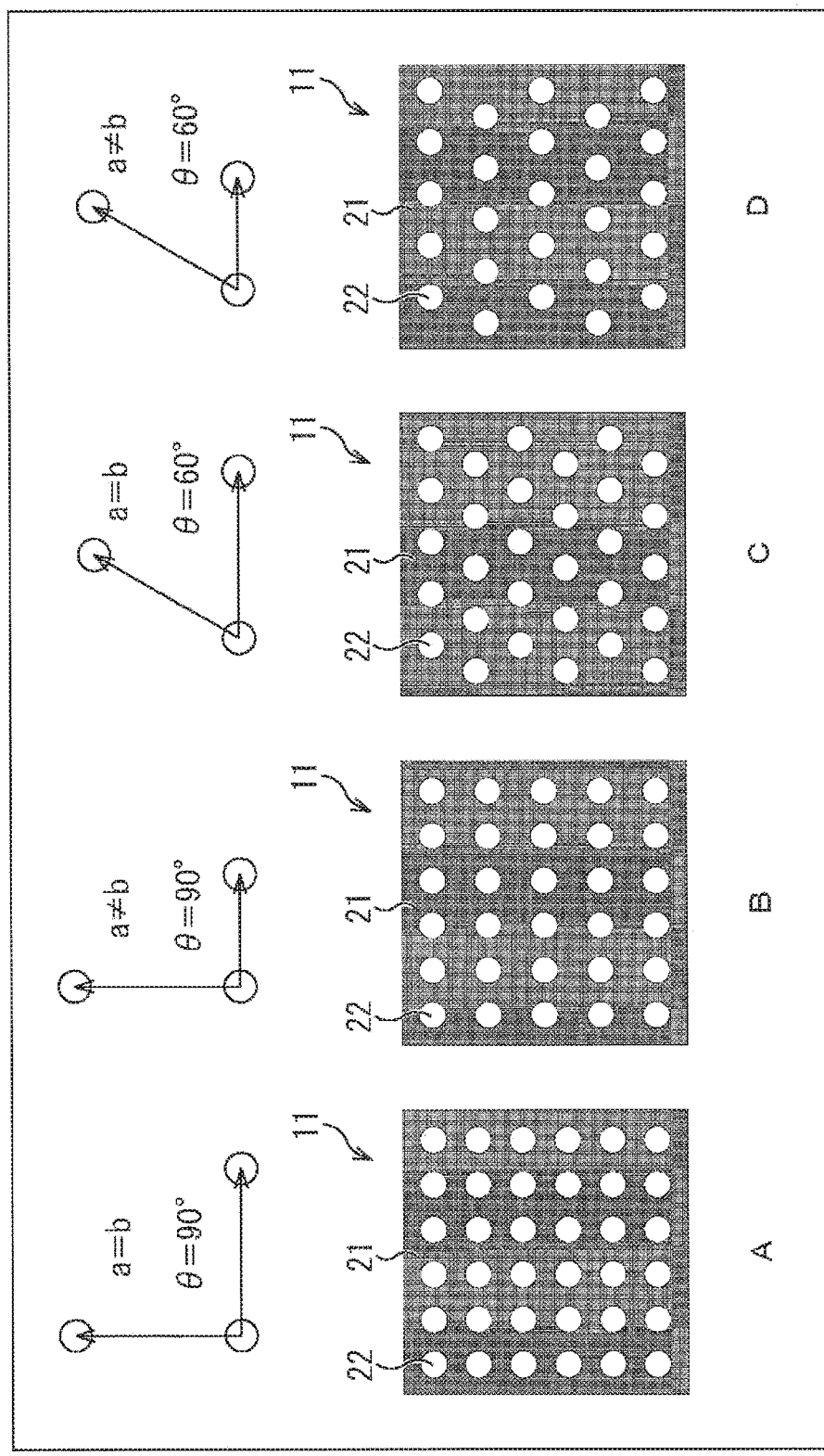
FIG. 9 is plan views showing other examples of the structure of the hole array filter.

FIG. 9 shows examples of the structure of the hole array filter in which openings are provided in various arrangement patterns.

In the hole array filter 11 shown in A of FIG. 9, openings 22 are arranged in the metal thin-film filter 21 in an arrangement pattern in which the distances a and b between two openings 22 adjacent in the horizontal direction and the vertical direction are an equal distance and the angle between the directions in which they are located is 90°, that is, in a square array.

In the hole array filter 11 shown in B of FIG. 9, openings 22 are arranged in the metal thin-film filter 21 in an arrangement pattern in which the distances a and b between two openings 22 adjacent in the horizontal direction and the vertical direction are different distances and the angle between the directions in which they are located is 90°.

In the hole array filter 11 shown in C of FIG. 9, openings 22 are arranged in the metal thin-film filter 21 in an arrangement pattern in which the distances a and b between two openings 22 adjacent in the horizontal direction and the vertical direction are an equal distance and the angle between the directions in which they are located is 60°, that is, in a triangular array.

In the hole array filter 11 shown in D of FIG. 9, openings 22 are arranged in the metal thin-film filter 21 in an arrangement pattern in which the distances a and b between two openings 22 adjacent in the horizontal direction and the vertical direction are different distances and the angle between the directions in which they are located is 60°.

As the shape of the opening of the hole array filter 11 shown in FIG. 9, the shapes of the opening described with reference to FIG. 8 or FIG. 9 may be used.

In the hole array filter to which the present technology is applied, the opening formed in the metal thin-film filter may be a through trench in a rectangular shape (a slit).

Figure 10:
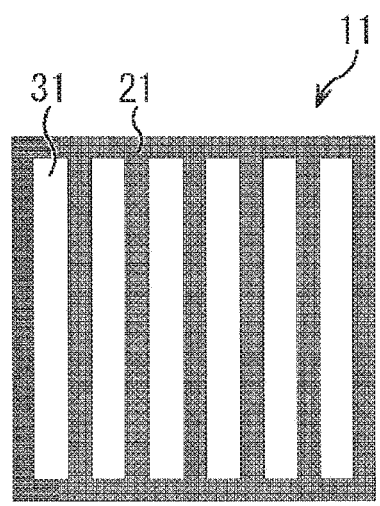
FIG. 10 is a plan view showing another example of the structure of the hole array filter.

FIG. 10 shows an example of the structure of the hole array filter in which the opening is formed as a slit.

In the hole array filter 11 shown in FIG. 10, the opening is formed as a slit 31 in a rectangular shape in the metal thin-film filter 21, and slits 31 are aligned in its short side direction.

In the hole array filter 11 shown in FIG. 10, the slit 31 is formed such that its long side is longer than the wavelength of the light that the hole array filter 11 allows to be transmitted and its short side is shorter than the wavelength of the light that the hole array filter 11 allows to be transmitted.

By such a structure, polarized light parallel to the long side direction of the slit (the slit direction) can be reflected, and polarized light perpendicular to the slit direction can be transmitted; thereby, the hole array filter 11 can be made to function as a light polarizing filter.

Thus, the present technology can be applied to hole array filters including openings having the shapes and the arrangement patterns described with reference to FIG. 7 to FIG. 10.

<Example of the Configuration of the Solid State Imaging Device>

Next, an example of the configuration of a solid state imaging device to which the present technology is applied is described with reference to FIG. 11.

Figure 11:
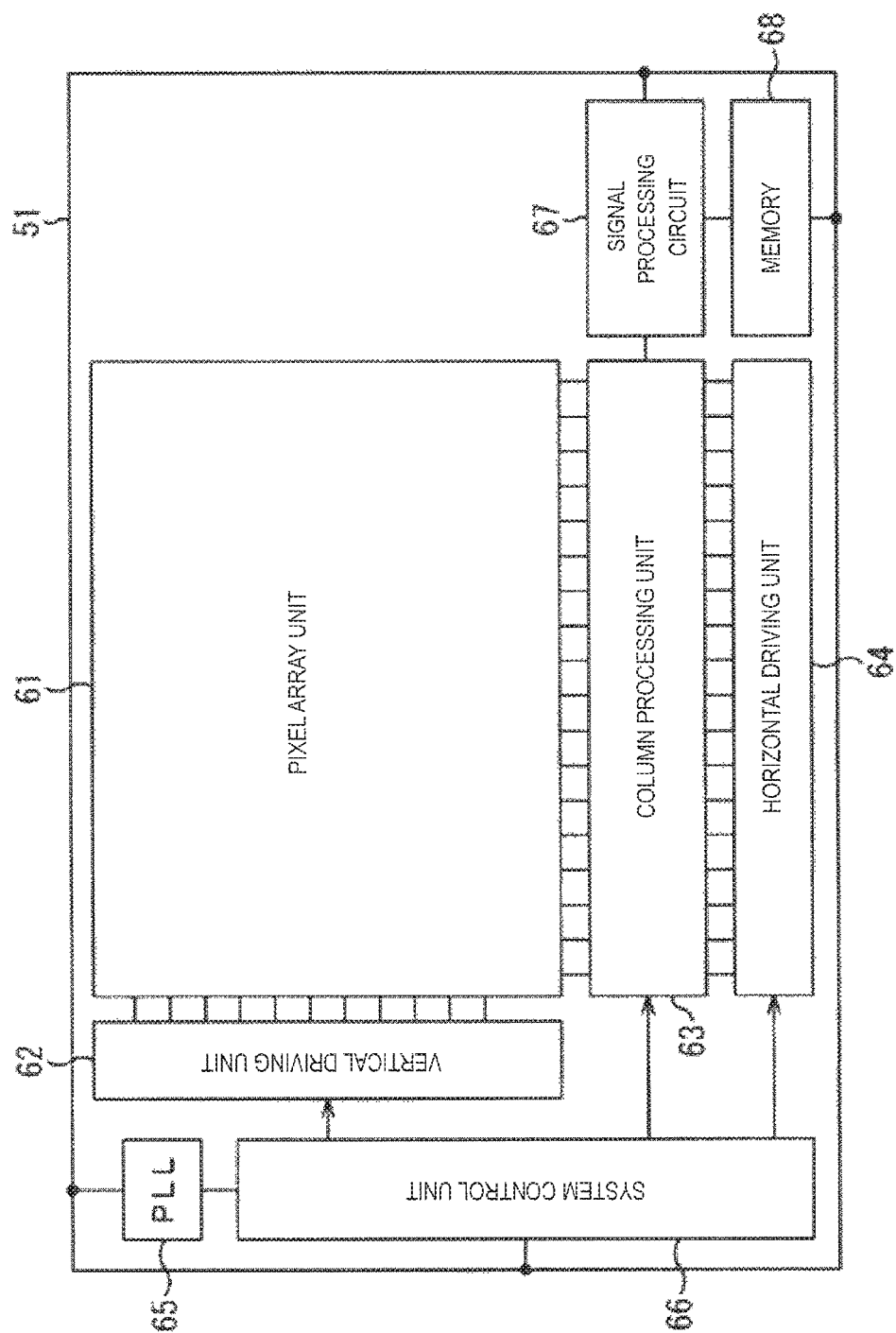
FIG. 11 is a block diagram showing an example of the configuration of a solid state imaging device to which the present technology is applied.

A solid state imaging device 51 shown in FIG. 11 may be formed as a front-side illumination CMOS image sensor, which is a kind of amplifying solid state imaging device, or may be formed as a back-side illumination CMOS image sensor, some other amplifying solid state imaging device, or a charge transfer solid state imaging device such as a CCD image sensor.

The solid state imaging device 51 shown in FIG. 11 has a configuration including a pixel array unit 61 formed on a not-shown semiconductor substrate and a peripheral circuit unit integrated on the same semiconductor substrate as the pixel array unit 61. The peripheral circuit unit is composed of, for example, a vertical driving unit 62, a column processing unit 63, a horizontal driving unit 64, a PLL circuit 65, and a system control unit 66.

The solid state imaging device 51 further includes a signal processing circuit 67 and a memory 68.

The pixel array unit 61 has a configuration in which unit pixels (hereinafter, simply referred to as pixels) each of which includes a photoelectric conversion unit that generates and stores a light charge in accordance with the amount of light received are two-dimensionally arranged in the row direction and the column direction, that is, in a matrix configuration. Here, the row direction refers to the direction of arrangement of pixels of the pixel row (the horizontal direction), and the column direction refers to the direction of arrangement of pixels of the pixel column (the vertical direction).

In the pixel array unit 61, for the pixel arrangement in a matrix configuration, a pixel driving line is drawn along the row direction for each pixel row, and a vertical signal line is drawn along the column direction for each pixel column. The pixel driving line transmits a driving signal for performing driving at the time of reading out a signal from the pixel. One end of the pixel driving line is connected to an output terminal corresponding to each row of the vertical driving unit 62.

The vertical driving unit 62 is composed of a shift register, an address decoder, etc., and drives all the pixels of the pixel array unit 61 simultaneously, alternatively in units of rows, or in other manners. That is, the vertical driving unit 62, together with the system control unit 66 that controls the vertical driving unit 62, constitutes a driving unit that drives each pixel of the pixel array unit 61.

A signal outputted from each unit pixel of a pixel row driven by the vertical driving unit 62 is inputted to the column processing unit 63 via each vertical signal line for each pixel column. The column processing unit 63 performs, for each pixel column of the pixel array unit 61, a prescribed signal processing on the signal outputted from each pixel of the selected row via the vertical signal line, and temporarily retains a pixel signal after the signal processing.

Specifically, the column processing unit 63 performs, as signal processing, at least denoising processing, for example correlated double sampling (CDS) processing. By the CDS processing by the column processing unit 63, fixed pattern noise peculiar to the pixel, such as reset noise and the threshold variation of an amplifying transistor in the pixel, is eliminated. The column processing unit 63 may be provided with, other than the denoising processing function, an analog-digital (A/D) conversion function, for example, and can thereby convert an analog pixel signal to a digital signal and cause the digital signal to be outputted.

The horizontal driving unit 64 is composed of a shift register, an address decoder, etc., and sequentially selects unit circuits corresponding to the pixel columns of the column processing unit 63. By the selective scanning by the horizontal driving unit 64, pixel signals that have undergone signal processing in the column processing unit 63 on a unit circuit basis are sequentially outputted.

The system control unit 66 is composed of a timing generator that generates various timing signals using a clock signal generated by the PLL circuit 65 as a reference, etc., and performs, on the basis of various timing signals generated by the timing generator, the driving control of the vertical driving unit 62, the column processing unit 63, the horizontal driving unit 64, etc.

The signal processing circuit 67 has at least an arithmetic processing function, and performs various signal processings such as arithmetic processing on a pixel signal outputted from the column processing unit 63. The pixel signal outputted from the column processing unit 63 has only intensity information corresponding to the color filter provided for each pixel; hence, the intensity information of a color component of each pixel is restored from the intensity information of an adjacent pixel of a different color by interpolation processing such as demosaic processing or convolution processing. Further, processings such as white balance and gamma correction, contour enhancement, and image compression may be performed, and thereby the image obtained can be restored to an image faithful to the subject.

The memory 68 temporarily stores data necessary for signal processing in the signal processing circuit 67.

The signal processing circuit 67 and the memory 68 may be mounted on the same substrate (semiconductor substrate) as the solid state imaging device 51, or may be placed on a different substrate from the solid state imaging device 51. Each processing of the signal processing circuit 67 and the memory 68 may be executed as a processing by an external signal processing unit provided on a different substrate from the solid state imaging device 51, such as a digital signal processor (DSP) circuit or a software application.

In the case where the solid state imaging device 51 is a back-side illumination CMOS image sensor, the solid state imaging device 51 may be configured as a stacked CMOS image sensor in which a semiconductor substrate including the pixel array unit 61 and a semiconductor substrate including a logic circuit are attached together.

<Example of the Configuration of the Pixel>
(Circuit Configuration)

Figure 12:
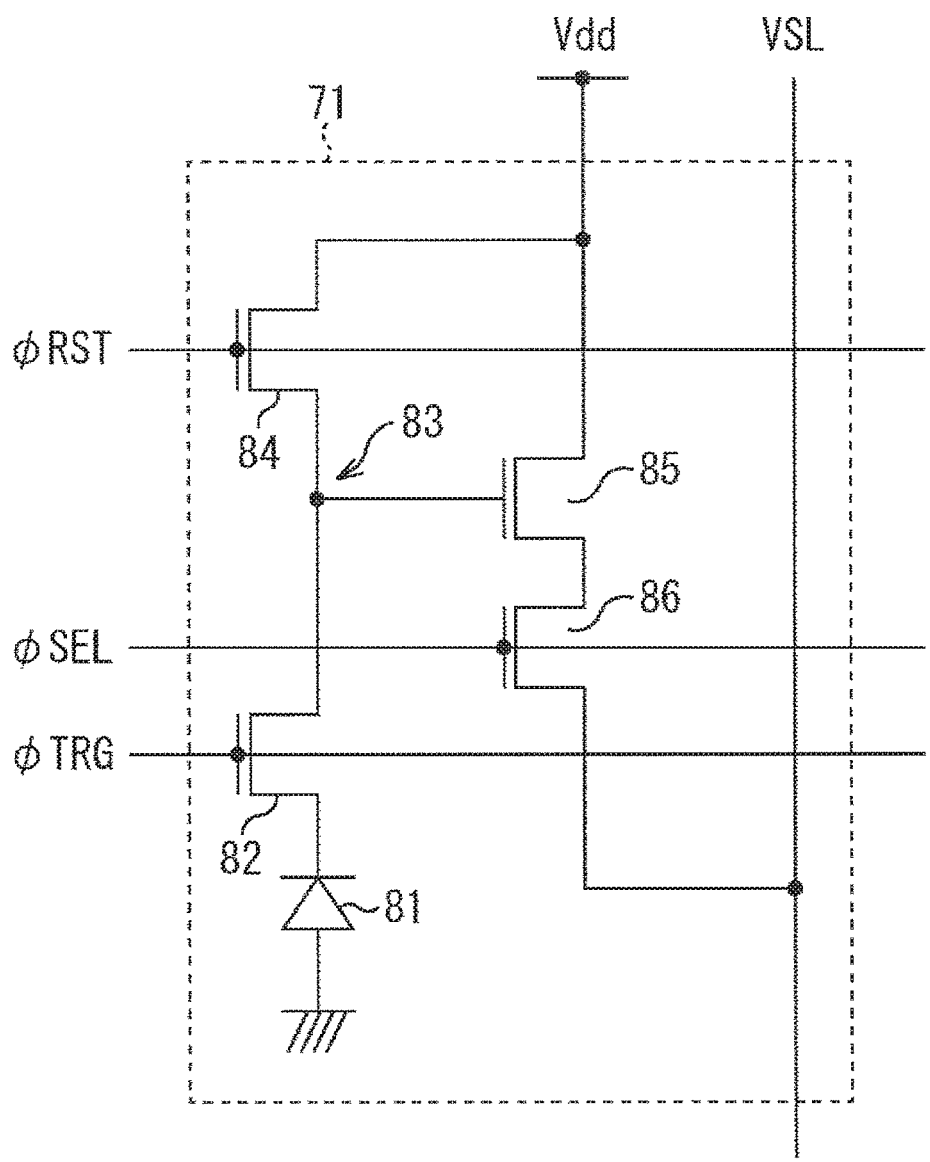
FIG. 12 is a circuit diagram showing an example of the configuration of a pixel of the solid state imaging device to which the present technology is applied.

FIG. 12 is a circuit diagram showing an example of the configuration of the pixel placed in the pixel array unit 61.

As shown in FIG. 12, a pixel 71 is placed at each point at which pixel driving lines RST, SEL, and TRG connected to the vertical driving unit 62 and a vertical signal line VSL connected to the column processing unit 63 cross, and is composed of a photodiode that performs photoelectric conversion and several types of transistors for reading out a signal stored.

Specifically, the pixel 71 includes a photodiode 81, a transfer transistor 82, a floating diffusion 83, a reset transistor 84, an amplifying transistor 85, and a select transistor 86.

The charge stored in the photodiode 81 is transferred to the floating diffusion 83 via the transfer transistor 82. The floating diffusion 83 is connected to the gate of the amplifying transistor 85. When the pixel 71 is an object to be read, the select transistor 86 is set to ON, and the amplifying transistor 85 is driven as a source follower; thereby, a signal corresponding to the amount of charge transferred to the floating diffusion 83 is read out to the vertical signal line VSL as a pixel signal of the pixel 71. The charge transferred to the floating diffusion 83 is reset by the resetting transistor 84 being set to ON.

(Cross-Sectional Configuration)

Figure 13:
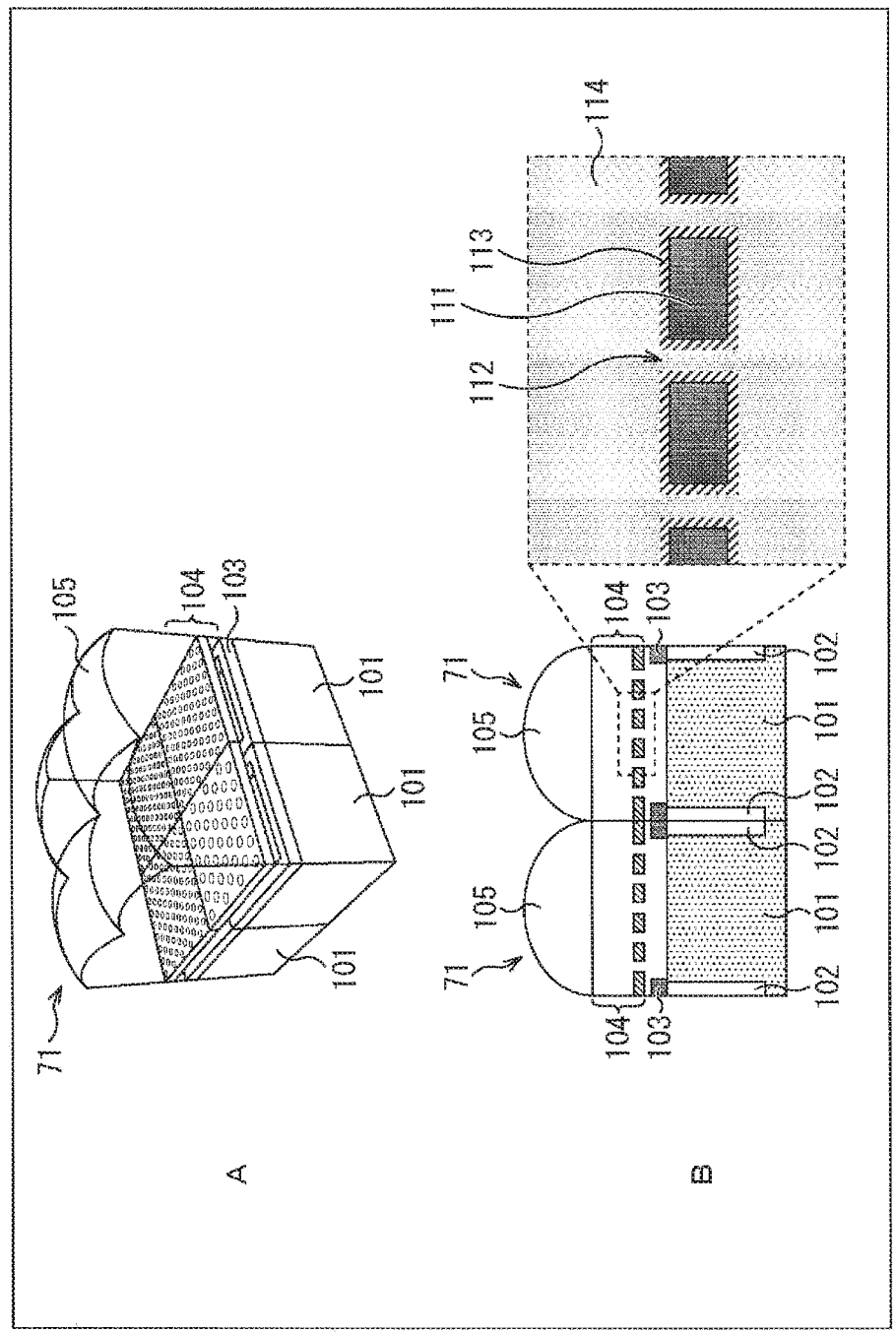
FIG. 13 is cross-sectional views showing an example of the configuration of pixels of the solid state imaging device to which the present technology is applied.

FIG. 13 is cross-sectional views showing an example of the configuration of the pixel 71 described above. A of FIG. 13 shows a perspective view of a portion of 2×2 pixels cut out of pixels 71 arranged two-dimensionally in a matrix configuration, and B of FIG. 13 shows a cross-sectional view of a portion of adjacent two pixels cut out of the pixels 71.

As shown in FIG. 13, in the pixel 71, a photoelectric conversion unit 101 that receives and photoelectrically converts incident light is formed on a not-shown semiconductor substrate. A light blocking wall 102 for preventing color mixing between pixels is formed at the boundary with an adjacent pixel 71 in the photoelectric conversion unit 101, and a light blocking member 103 for preventing color mixing between pixels is formed at the boundary with an adjacent pixel 71 on the photoelectric conversion unit 101.

An optical filter 104 having spectral characteristics in accordance with each pixel 71 is formed on the photoelectric conversion unit 101, and a microlens 105 is formed on the optical filter 104.

In FIG. 13, the hole array filter of the embodiment described above is provided as the optical filter 104.

Specifically, as shown in B of FIG. 13, the optical filter 104 includes a metal thin-film filter 111 in which a plurality of openings 112 are periodically arranged, a dielectric layer 113 that coats the surface of the metal thin-film filter 111 and is formed so as to coat or fill the interior of the opening 112, and a dielectric layer 114 that has a refractive index lower than the refractive index of the dielectric layer 113 and is formed at least on the incidence surface side of the metal thin-film filter 111.

The metal thin-film filter 111, the opening 112, and the dielectric layers 113 and 114 shown in FIG. 13 correspond to, for example, the metal thin-film filter 21, the opening 22, and the dielectric layers 24 and 23 described with reference to FIG. 4, respectively, and a description thereof is omitted.

The hole array filter basically does not transmit the components on the side of longer wavelengths than the wavelength range of the electromagnetic wave intended to be transmitted in the plasmonic mode; therefore, by using the hole array filter as a color filter of a solid state imaging device that transmits the wavelength range of ultraviolet light and visible light, infrared light on the side of longer wavelengths than the wavelength range of visible light can be cut. Thus, there is no need to provide an infrared cut filter, and it becomes possible to reduce the cost for manufacturing.

Furthermore, by the hole array filter to which the present technology is applied, exclusively peaks in the photonic mode out of the plurality of peaks in the transmission characteristics that the conventional hole array filter has can be selectively suppressed; therefore, by using the hole array filter of the present technology as a color filter of a solid state imaging device, exclusively a pixel signal of a desired color component can be obtained for each pixel; thus, the calculation at the time of restoring RGB images or multi-color images is simplified in the signal processing circuit that performs signal processing on the pixel signal, and the occurrence of color mixing and false color can be suppressed and therefore the degradation of image quality can be suppressed.

<Example of the Configuration of the Electronic Apparatus>

Next, an example of the configuration of an electronic apparatus to which the present technology is applied is described with reference to FIG. 14.

Figure 14:
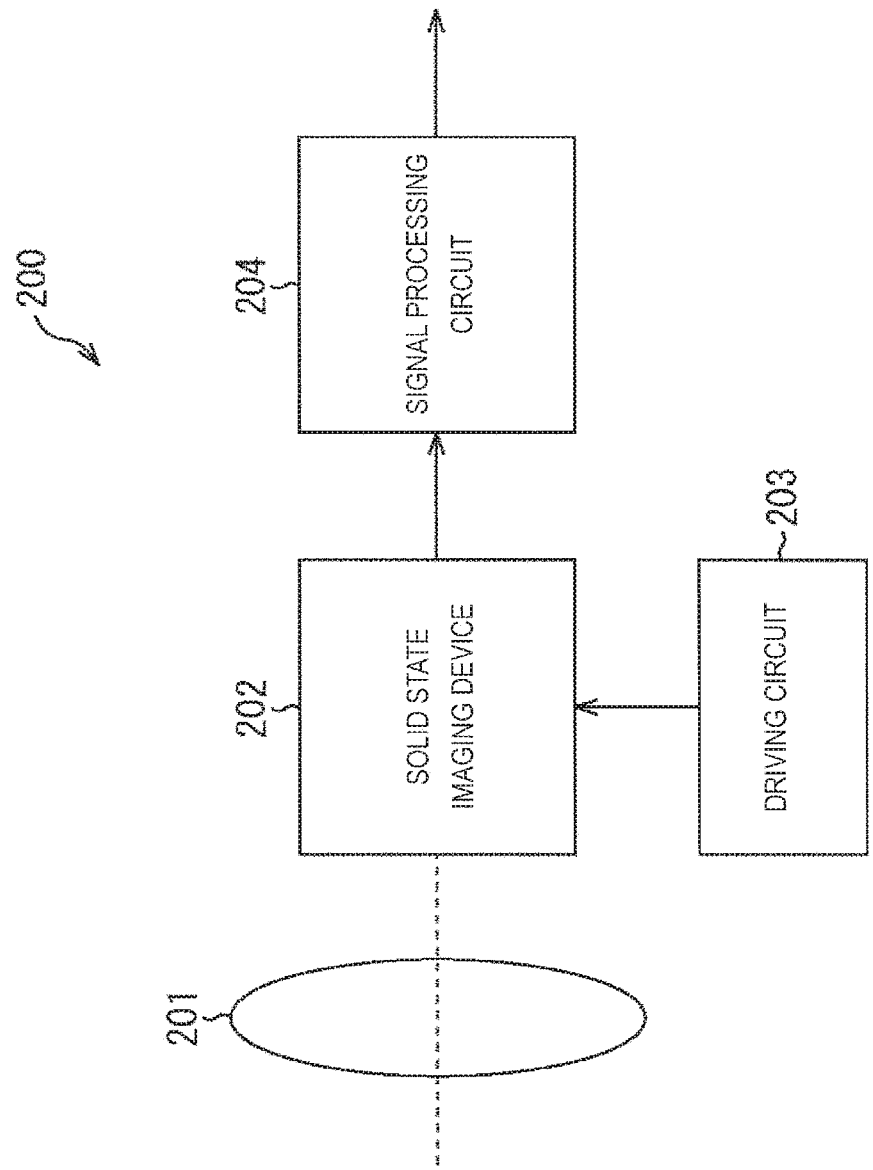
FIG. 14 is a block diagram showing an example of the configuration of an electronic apparatus to which the present technology is applied.

An electronic apparatus 200 shown in FIG. 14 includes an optical lens 201, a solid state imaging device 202, a driving circuit 203, and a signal processing circuit 204. In FIG. 14, a configuration in the case where the solid state imaging device 51 including the optical filter of the embodiment described above is provided as the solid state imaging device 202 in an electronic apparatus (e.g. a digital still camera) is shown.

The optical lens 201 causes image light (incident light) from a subject to form an image on the imaging surface of the solid state imaging device 202. Thereby, a signal charge is stored in the solid state imaging device 202 for a certain period.

The driving circuit 203 supplies a driving signal that controls the signal transfer operation of the solid state imaging device 202. Based on the driving signal (timing signal) supplied from the driving circuit 203, the solid state imaging device 202 performs signal transfer. The signal processing circuit 204 performs various signal processings on a signal outputted from the solid state imaging device 202. A video signal that has undergone signal processing is stored in a storage medium such as a memory, or is outputted to a monitor.

In the electronic apparatus 200 of the embodiment of the present technology, in the solid state imaging device 202, the calculation at the time of restoring RGB images or multi-color images is simplified, and the occurrence of color mixing and false color can be suppressed, the degradation of image quality can be suppressed, and as a result an image of high image quality can be obtained at a higher speed.

The embodiment of the present technology is not limited to the embodiments described above, and various alterations are possible without departing from the spirit of the present technology.

Additionally, the present technology may also be configured as below.

(1)

An optical filter including:

a metal thin-film filter in which a plurality of openings are periodically arranged;

a first dielectric layer coating a surface of the metal thin-film filter and formed so as to coat or fill an interior of the opening of the metal thin-film filter; and a second dielectric layer having a refractive index lower than a refractive index of the first dielectric layer and formed at least on an incidence surface side of the metal thin-film filter, wherein an opening diameter of the metal thin-film filter is smaller than a wavelength in the second dielectric layer of an electromagnetic wave to be transmitted, and a thickness of the first dielectric layer is substantially equal to or thinner than the wavelength in the second dielectric layer of the electromagnetic wave.

(2)

The optical filter according to (1), wherein a real part of a complex refractive index of a material that forms the first dielectric layer is larger than a real part of a complex refractive index of a material that forms the second dielectric layer.

(3)

The optical filter according to (1) or (2), wherein the second dielectric layer is formed also on an emitting surface side of the metal thin-film filter.

(4)

The optical filter according to any of (1) to (3), wherein a spacing between openings of the metal thin-film filter is set to a distance substantially equal to a wavelength of the electromagnetic wave.

(5)

The optical filter according to (4), wherein, when the wavelength of the electromagnetic wave is denoted by $\lambda$ and a real part of a complex refractive index of the first dielectric layer is denoted by N, the spacing between openings of the metal thin-film filter is set to a distance of $0.5\lambda/N$ to $2.0\lambda/N$.

(6)

The optical filter according to (1), wherein the metal thin-film filter is made of Al, Ag, Au, Cu, and W, or an alloy containing any of them.

(7)

The optical filter according to (1), wherein a thickness of the metal thin-film filter is set between 50 nm to 300 nm.

(8)

The optical filter according to (1), wherein the first dielectric layer is made of silicon nitride, hafnium oxide, aluminum oxide, titanium oxide, zirconium oxide, and tantalum oxide, or a material containing any of them.

(9)

The optical filter according to (1), wherein the second dielectric layer is made of a material containing any of silicon oxide and magnesium fluoride.

(10)

The optical filter according to any of (1) to (9), wherein a shape of the opening of the metal thin-film filter is a circle, a square, or a cross shape or a square U shape in which a horizontal to vertical ratio is 1:1.

(11)

The optical filter according to any of (1) to (9), wherein a shape of the opening of the metal thin-film filter is an ellipse, a rectangular shape, or a cross shape or a square U shape in which a horizontal to vertical ratio is not 1:1.

(12)

The optical filter according to any of (1) to (11), wherein the openings of the metal thin-film filter are arranged in a square array.

(13)

The optical filter according to any of (1) to (11), wherein the openings of the metal thin-film filter are arranged in a triangular array.

(14)

The optical filter according to any of (1) to (9), wherein the openings of the metal thin-film filter are each formed as a slit, and are aligned in a short side direction of the slit.

(15)

A solid state imaging device including:

an optical filter including a metal thin-film filter in which a plurality of openings are periodically arranged, a first dielectric layer coating a surface of the metal thin-film filter and formed so as to coat or fill an interior of the opening of the metal thin-film filter, and a second dielectric layer having a refractive index lower than a refractive index of the first dielectric layer and formed at least on an incidence surface side of the metal thin-film filter, wherein an opening diameter of the metal thin-film filter is smaller than a wavelength in the second dielectric layer of an electromagnetic wave to be transmitted, and a thickness of the first dielectric layer is substantially equal to or thinner than the wavelength in the second dielectric layer of the electromagnetic wave.

(16)

An electronic apparatus including:

a solid state imaging device including an optical filter including a metal thin-film filter in which a plurality of openings are periodically arranged, a first dielectric layer coating a surface of the metal thin-film filter and formed so as to coat or fill an interior of the opening of the metal thin-film filter, and a second dielectric layer having a refractive index lower than a refractive index of the first dielectric layer and formed at least on an incidence surface side of the metal thin-film filter, wherein an opening diameter of the metal thin-film filter is smaller than a wavelength in the second dielectric layer of an electromagnetic wave to be transmitted, and a thickness of the first dielectric layer is substantially equal to or thinner than the wavelength in the second dielectric layer of the electromagnetic wave.

REFERENCE SIGNS LIST

11 hole array filter
21 metal thin-film filter
22 opening
23,24 dielectric layer
31 opening 51 solid state imaging device
71 pixel
104 optical filter
200 electronic apparatus
202 solid state imaging device

The invention claimed is:

1. An optical filter, comprising:
    a metal thin-film filter that comprises a plurality of openings, wherein
        the plurality of openings is periodically arranged in a triangular array in the metal thin-film filter,
        in the triangular array a horizontal distance is different from a vertical distance,
        the horizontal distance is a distance between a first opening of the plurality of openings and a second adjacent opening of the plurality of openings in a horizontal direction, and
        the vertical distance is a distance between the first opening of the plurality of openings and a third adjacent opening of the plurality of openings in a vertical direction;
    a first dielectric layer on a surface of the metal thin-film filter,
        wherein the first dielectric layer coats an entire portion of an inner wall of each opening of the plurality of openings of the metal thin-film filter; and
    a second dielectric layer having a first refractive index lower than a second refractive index of the first dielectric layer, wherein
        the second dielectric layer is above an incidence surface side of the metal thin-film filter and below an emitting surface side of the metal thin-film filter,
        an electromagnetic wave is incident on the incidence surface side and transmitted to the emitting surface side, and
        a thickness of the first dielectric layer is equal to or thinner than an effective wavelength of the transmitted electromagnetic wave in the second dielectric layer.

2. The optical filter according to claim 1, wherein
a first real part of a first complex refractive index of a first material of the first dielectric layer is larger than a second real part of a second complex refractive index of a second material of the second dielectric layer,
the first complex refractive index is associated with the second refractive index of the first dielectric layer, and
the second complex refractive index is associated with the first refractive index of the second dielectric layer.

3. The optical filter according to claim 1, wherein
a spacing between two openings of the plurality of openings of the metal thin-film filter is set to a distance equal to a wavelength of the electromagnetic wave to be transmitted, and
the spacing corresponds to a period.

4. The optical filter according to claim 3, wherein
the wavelength of the electromagnetic wave is denoted by $\lambda$,
a first real part of a first complex refractive index of a first material of the first dielectric layer is denoted by N,
the first complex refractive index is associated with the second refractive index of the first dielectric layer, and
the spacing between the two openings of the metal thin-film filter is set to a distance of $0.5\lambda/N$ to $2.0\lambda/N$.

5. The optical filter according to claim 1, wherein
the metal thin-film filter comprises one of Aluminum (Al), Silver (Ag), Gold (Au), Copper (Cu), or Tungsten (W), or an alloy of at least one of Al, Ag, Au, Cu, or W.

6. The optical filter according to claim 1, wherein
a thickness of the metal thin-film filter is set between 50 nm to 300 nm.

7. The optical filter according to claim 1, wherein
the first dielectric layer comprises at least one of silicon nitride, hafnium oxide, aluminum oxide, titanium oxide, zirconium oxide, or tantalum oxide.

8. The optical filter according to claim 1, wherein
the second dielectric layer comprises a material of at least one of silicon oxide or magnesium fluoride.

9. The optical filter according to claim 1, wherein
a shape of each opening of the plurality of openings of the metal thin-film filter is a rectangular shape in which a horizontal to vertical ratio is different from 1:1.

10. The optical filter according to claim 1, wherein
each opening of the plurality of openings of the metal thin-film filter is a slit,
a first side of the slit is longer than a second side of the slit,
the first side of the slit is longer than a wavelength of the incident electromagnetic wave,
the second side of the slit is shorter than the wavelength of the incident electromagnetic wave, and
the plurality of openings is aligned in a short side direction of the slit.

11. A solid state imaging device, comprising:
an optical filter including:
    a metal thin-film filter that comprises a plurality of openings, wherein
        the plurality of openings is periodically arranged in a triangular array in the metal thin-film filter,
        in the triangular array a horizontal distance is different from a vertical distance,
        the horizontal distance is a distance between a first opening of the plurality of openings and a second adjacent opening of the plurality of openings in a horizontal direction, and
        the vertical distance is a distance between the first opening of the plurality of openings and a third adjacent opening of the plurality of openings in a vertical direction;
    a first dielectric layer on a surface of the metal thin-film filter,
        wherein the first dielectric layer coats an entire portion of an inner wall of each opening of the plurality of openings of the metal thin-film filter; and
    a second dielectric layer having a first refractive index lower than a second refractive index of the first dielectric layer, wherein
        the second dielectric layer is above an incidence surface side of the metal thin-film filter and below an emitting surface side of the metal thin-film filter,
        an electromagnetic wave is incident on the incidence surface side and transmitted to the emitting surface side, and
        a thickness of the first dielectric layer is equal to or thinner than an effective wavelength of the transmitted electromagnetic wave in the second dielectric layer.

12. An electronic apparatus, comprising:
a solid state imaging device including:
    an optical filter including:
        a metal thin-film filter that comprises a plurality of openings, wherein the plurality of openings is periodically arranged in a triangular array in the metal thin-film filter, in the triangular array a horizontal distance is different from a vertical distance, the horizontal distance is a distance between a first opening of the plurality of openings and a second adjacent opening of the plurality of openings in a horizontal direction, and the vertical distance is a distance between the first opening of the plurality of openings and a third adjacent opening of the plurality of openings in a vertical direction;

a first dielectric layer on a surface of the metal thin-film filter, wherein the first dielectric layer coats an entire portion of an inner wall of each opening of the plurality of openings of the metal thin-film filter; and a second dielectric layer having a first refractive index lower than a second refractive index of the first dielectric layer, wherein the second dielectric layer is above an incidence surface side of the metal thin-film filter and below an emitting surface side of the metal thin-film filter, an electromagnetic wave is incident on the incidence surface side and transmitted to the emitting surface side, and a thickness of the first dielectric layer is equal to or thinner than a second wavelength of the transmitted electromagnetic wave in the second dielectric layer.

* * * * *